(12) United States Patent
Wei et al.

(10) Patent No.: US 10,797,159 B2
(45) Date of Patent: Oct. 6, 2020

(54) POLY FINGER FABRICATION FOR HCI DEGRADATION IMPROVEMENT OF ULTRA-LOW-RON EDNMOS

(71) Applicant: GLOBALFOUNDRIES Singapore Pte. Ltd., Singapore (SG)

(72) Inventors: Lin Wei, Singapore (SG); Upinder Singh, Singapore (SG); Raj Verma Purakh, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/396,305

(22) Filed: Apr. 26, 2019

(65) Prior Publication Data
US 2019/0252521 A1    Aug. 15, 2019

Related U.S. Application Data

(62) Division of application No. 15/656,816, filed on Jul. 21, 2017, now Pat. No. 10,319,834.

(51) Int. Cl.
| | |
|---|---|
| *H01L 29/66* | (2006.01) |
| *H01L 21/311* | (2006.01) |
| *H01L 21/283* | (2006.01) |
| *H01L 29/78* | (2006.01) |
| *H01L 29/40* | (2006.01) |
| *H01L 27/092* | (2006.01) |
| *H01L 21/8238* | (2006.01) |

(52) U.S. Cl.
CPC ...... *H01L 29/66659* (2013.01); *H01L 21/283* (2013.01); *H01L 21/31116* (2013.01); *H01L 21/31144* (2013.01); *H01L 21/823814* (2013.01); *H01L 27/0928* (2013.01); *H01L 29/402* (2013.01); *H01L 29/6656* (2013.01); *H01L 29/66553* (2013.01); *H01L 29/7835* (2013.01)

(58) Field of Classification Search
CPC .................. H01L 21/82385; H01L 21/823864
See application file for complete search history.

(56) References Cited

U.S. PATENT DOCUMENTS

| | | | |
|---|---|---|---|
| 6,252,278 B1 | 6/2001 | Hsing | |
| 2008/0014690 A1* | 1/2008 | Chu | .................. H01L 29/66659 438/197 |
| 2010/0163967 A1* | 7/2010 | Yun | .................. H01L 27/11521 257/324 |
| 2014/0103968 A1 | 4/2014 | Heringa et al. | |
| 2018/0122818 A1 | 5/2018 | Tseng et al. | |

\* cited by examiner

*Primary Examiner* — Wael M Fahmy
*Assistant Examiner* — Sarah K Salerno
(74) *Attorney, Agent, or Firm* — Ditthavong & Steiner P.C.

(57) ABSTRACT

Methods of forming an EDNMOS with polysilicon fingers between a gate and a nitride spacer and the resulting devices are provided. Embodiments include forming a polysilicon layer upon a GOX layer over a substrate; forming a gate and plurality of fingers and a gate and plurality of fingers through the polysilicon layer down the GOX layer; forming an oxide layer over the GOX layer and sidewalls of the gates and fingers; forming a nitride layer over the oxide layer; removing portions of the nitride and oxide layers down to the polysilicon and GOX layers to form nitride spacers; and forming S/D regions laterally separated in the substrate, each S/D region adjacent to a nitride spacer.

17 Claims, 7 Drawing Sheets

POLY FINGER FABRICATION FOR HCI DEGRADATION IMPROVEMENT OF ULTRA-LOW-RON EDNMOS

RELATED APPLICATION

The present application is a Divisional of U.S. application Ser. No. 15/656,816, filed on Jul. 21, 2017, which is incorporated herein by reference.

TECHNICAL FIELD

The present disclosure relates to the manufacture of a semiconductor device with a relatively low on-resistance (Ron). The disclosure is particularly applicable to extended drain n-type metal-oxide-semiconductor (EDNMOS) transistors.

BACKGROUND

The problems with traditional EDNMOS transistors are mainly related to high electrical field crowding at the edge of the channel due to nitride spacers acting as the sinker of charge spreading, which accelerates hot carrier injection (HCI) degradation. A known approach to improve the HCI performance of an EDNMOS is depicted in FIG. 1. Adverting to FIG. 1 (a cross-sectional view), a P-type well (p-well) 101 and an N-type drift or drain extension region (N−) 103 are formed in a substrate 105. A polysilicon gate 107 having a gate oxide layer 109 and nitride spacers 111 is formed across the p-well 101 and N− 103 regions. A silicide blocked (SBLK) layer 113 is then formed over one of the spacers 111. Next, a P+ region 115 is formed in the P-well 101 and N+ regions 117 are formed in the P-well 101 and N− 103 regions, respectively. Thereafter, a metal field plate is formed over a shallow trench isolation (STI) region formed over the substrate 105 (both not shown for illustrative convenience). High electrical field crowding; however, still occurs at the edge of the channel (as depicted by the arrows 119) since the nitride spacers 111 still act as the sinker of charge spreading. In addition, a metal field plate does not work well for thick dielectric layers in complimentary metal-oxide-semiconductor (CMOS) processing.

Another known approach attempts to address this problem by replacing the nitride spacers 111 of FIG. 1 with polysilicon spacers. However, forming polysilicon spacers requires an additional mask, which is costly. A further known approach employs a polysilicon field plate instead of the metal field plate. However, the nitride spacers of the device are still the source of charge spreading at the edge of the channel.

A need therefore exists for methodology enabling formation of an EDNMOS with nitride spacers pushed away from the edge of the channel and the resulting device.

SUMMARY

An aspect of the present disclosure is a method of forming an EDNMOS with polysilicon fingers between a gate and a nitride spacer to push the nitride spacer away from the edge of the channel.

Another aspect of the present disclosure is an EDNMOS with polysilicon fingers between a gate and a nitride spacer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a polysilicon layer upon a gate oxide (GOX) layer over a substrate; forming a first gate and plurality of fingers and a second gate and plurality of fingers laterally separated through the polysilicon layer down the GOX layer; forming an oxide layer over the GOX layer and along sidewalls of the first and second gates and plurality of fingers; forming a nitride layer over the oxide layer; removing portions of the nitride and oxide layers down to the polysilicon and GOX layers to form a nitride spacer over and adjacent to a portion of the oxide layer on opposite sides of each gate and plurality of fingers; and forming source/drain (S/D) regions laterally separated in the substrate, each S/D region adjacent to a nitride spacer.

Aspects of the present disclosure include forming the GOX layer to a thickness of 40 angstrom (Å) to 80 Å. Additional aspects include the substrate being an N-type substrate (n-sub) having a first and a second P-type well (p-well) laterally separated. Other aspects include forming the first and second gates and plurality of fingers by: forming a photoresist layer over the polysilicon layer; patterning a first, second, and third pair of openings in the photoresist layer, the pairs and the openings being laterally separated and each of the first pair of openings being over the first and second p-well, respectively, and the second pair of openings being over the n-sub; patterning a single opening between and laterally separated from each opening of the third pair; etching the polysilicon layer through the pairs and the single opening down to the GOX layer; and stripping the photoresist layer. Further aspects include patterning each opening of the second and third pairs with a lateral width of 30 nanometer (nm) to 40 nm. Another aspect includes openings of the second and third pair and a distance between an opening of the third pair and the single opening having a lateral width of 30 nm to 40 nm. Other aspects include forming the oxide layer by: forming an oxidation layer to a thickness of 10 Å to 30 Å; forming a first low temperature oxide (LTO) layer to a thickness of 40 Å to 60 Å over the oxidation layer; and forming a second LTO layer to a thickness of 40 Å to 60 Å over the first LTO layer. Further aspects include forming the nitride layer to a thickness of 300 Å to 400 Å. Additional aspects include removing the portions of the nitride and oxide layers by: reactive-ion etching (RIE).

Another aspect of the present disclosure is a device including: a GOX layer over a substrate; a first gate and plurality of fingers over the GOX layer; a second gate and plurality of fingers over the GOX layer, the first and second gates and respective plurality of fingers laterally separated; an oxide layer along sidewalls of the first and second gates and plurality of fingers and over portions of the GOX layer; a nitride spacer over and adjacent to the oxide layer on opposite sides of each gate and pair of spacers; S/D regions laterally separated in the substrate, each S/D region adjacent to a nitride spacer.

Aspects of the device include the substrate being an N-type substrate (n-sub) having a first and a second P-type well (p-well) laterally separated. Additional aspects include the GOX layer having a thickness of 40 Å to 80 Å. Other aspects include a lateral width between a finger and a gate and between each finger of the plurality being 30 nm to 40 nm. Further aspects include each finger having a width of 30 nm to 40 nm. Another aspect includes the oxide layer being an oxidation layer having a thickness of 10 Å to 30 Å; a first LTO layer having a thickness of 40 Å to 60 Å over the oxidation layer; and a second LTO layer having a thickness of 40 Å to 60 Å over the first LTO layer. Other aspects include the nitride layer having a thickness of 300 Å to 400 Å.

A further aspect of the present disclosure is a method including: forming a first and a second p-well laterally separated in a n-sub; forming a GOX layer to a thickness of 40 Å to 80 Å over the n-sub; forming a polysilicon layer over the GOX layer; forming a first gate and plurality of fingers and a second gate and plurality of fingers laterally separated through the polysilicon layer down the GOX layer, the first and second gates formed across a portion of the first and second p-wells, respectively, and a portion the n-sub; forming an oxidation layer to a thickness of 10 Å to 30 Å over the GOX layer and along sidewalls of the first and second gates and fingers; forming a first and a second LTO layer to a thickness of 40 Å to 60 Å over the oxidation layer; forming a nitride layer to a thickness of 300 Å to 400 Å over the second LTO layer; removing portions of the nitride, first and second LTO, and oxidation layers down to the polysilicon and GOX layers to form a nitride spacer over and adjacent to a portion of the second LTO layer on opposite sides of each gate and plurality of fingers; and forming a S/D region in each p-well and the n-sub, each S/D region adjacent to a nitride spacer.

Aspects of the present disclosure include forming the first and second gates and plurality of fingers by: forming a photoresist layer over the polysilicon layer; patterning a first, second, and third pair of openings in the photoresist layer, the pairs and the openings being laterally separated; patterning a single opening between and laterally separated from each opening of the third pair; etching the polysilicon layer through the pairs and the single opening down to the GOX layer; and stripping the photoresist layer. Other aspects include patterning each opening of the second and third pairs and a distance between the openings with a lateral width of 30 nm to 40 nm. Further aspects include removing the portions of the nitride, first and second LTO, and oxidation layers by: RIE.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of HCI degradation of an EDNMOS due to current crowding at the edge of the channel in on state attendant upon forming an EDNMOS with nitride spacers. The problems are solved, inter alia, by forming an EDNMOS with polysilicon fingers between a gate and a nitride spacer to push the nitride spacer away from the edge of the channel.

Methodology in accordance with embodiments of the present disclosure includes forming a polysilicon layer upon a GOX layer over a substrate. A first gate and plurality of fingers and a second gate and plurality of fingers are formed laterally separated through the polysilicon layer down the GOX layer. An oxide layer is formed over the GOX layer and along sidewalls of the first and second gates and plurality of fingers. A nitride layer is formed over the oxide layer and portions of the nitride and oxide layers are removed down to the polysilicon and GOX layers to form a nitride spacer over and adjacent to a portion of the oxide layer on opposite sides of each gate and plurality of fingers. S/D regions laterally separated are formed in the substrate, each S/D region being adjacent to a nitride spacer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2 through 7 schematically illustrate cross-sectional views of a process flow for forming an EDNMOS with polysilicon fingers between a gate and a nitride spacer, in accordance with an exemplary embodiment. Adverting to FIG. 2, wells 201 and 203, e.g., p-wells, are formed in a substrate 205, e.g., an n-sub. A thick GOX layer 207 is formed, for example, to a thickness of 40 Å to 80 Å, e.g., 60 Å, over the substrate 205. A polysilicon layer 209 is then formed over the GOX layer 207.

Figure 1:
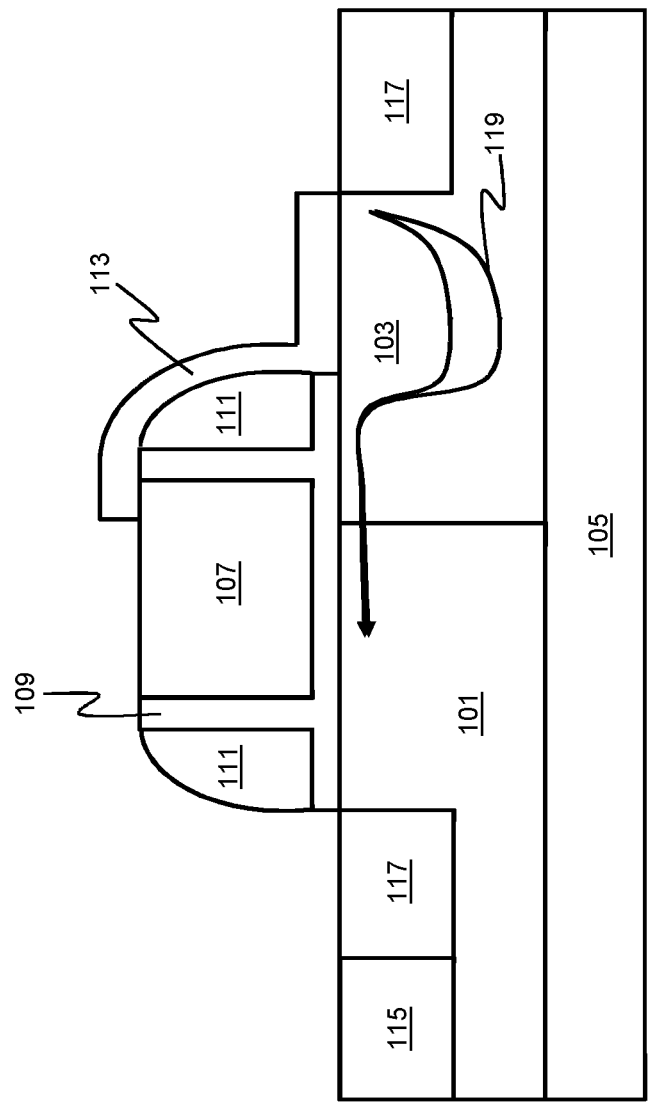
FIG. 1 schematically illustrates a cross-sectional view of a background EDNMOS with nitride spacers.
Figure 2:
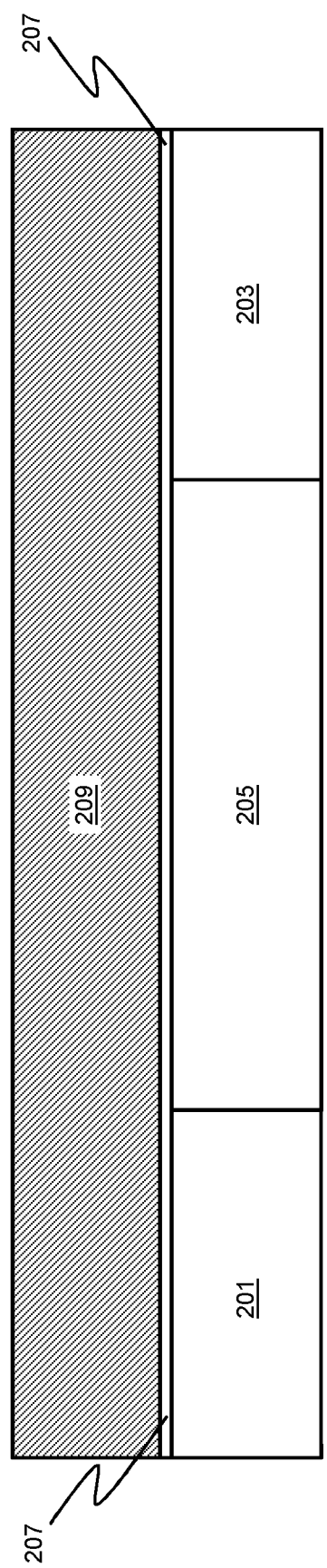
FIGS. 2 through 7 schematically illustrate cross-sectional views of a process flow for forming an EDNMOS with polysilicon fingers between a gate and a nitride spacer, in accordance with an exemplary embodiment.
Figure 3:
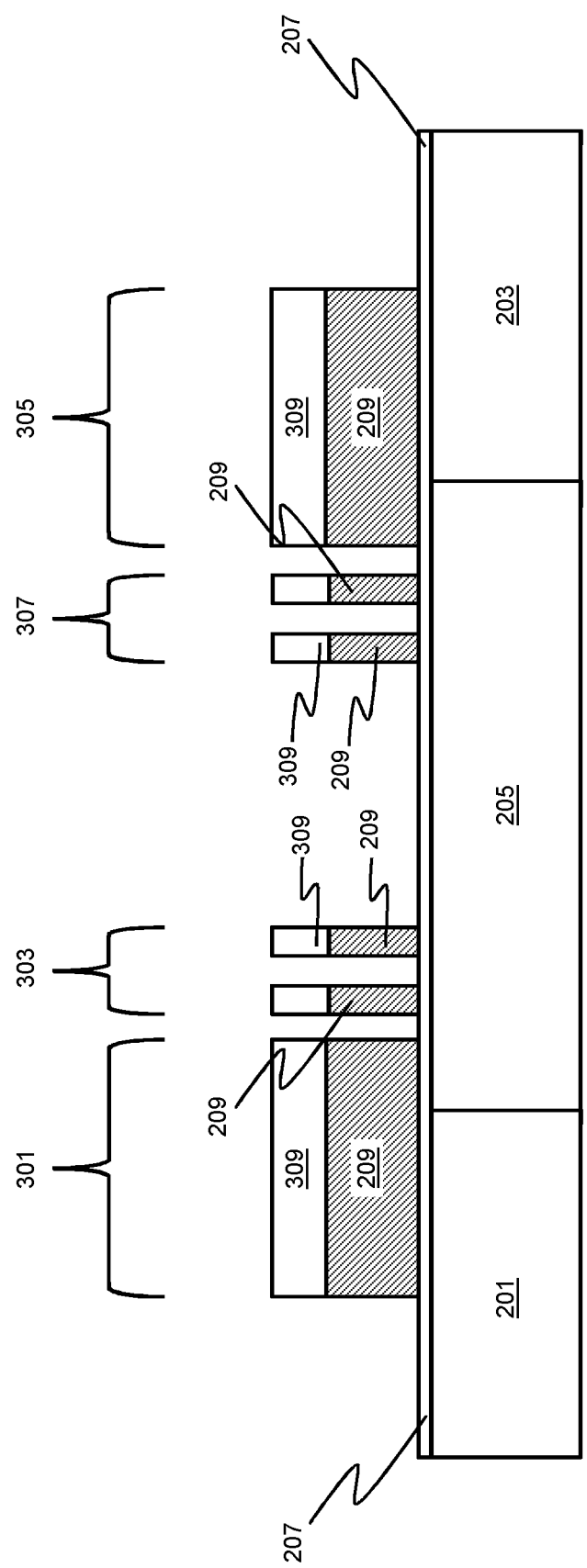

Next, gate 301 and fingers 303 and gate 305 and fingers 307 are formed over the GOX layer 207 by forming a photoresist layer 309 (not shown for illustrative convenience) over the polysilicon layer 209; patterning pairs of laterally separated openings in the photoresist layer 309 and a single opening between the central pair of openings; and etching the polysilicon layer 209 through each of the openings down to the GOX layer 207, as depicted in FIG. 3. For example, a first pair of openings may be patterned over the wells 201 and 203, each opening on an opposite side of the subsequently formed gates 301 and 305, respectively; a second pair of openings may be patterned over the substrate 205 between the subsequently formed gates 301 and 305 and the subsequently formed fingers 303 and 307, respectively; a third pair of openings may be patterned between each of the subsequently formed fingers 303 and 307; and a fourth opening may be patterned between the subsequently formed fingers 303 and 307. The second and third pairs of openings are designed by minimum line and space requirements such that each opening may be formed, e.g., with a lateral width of 30 nm to 40 nm, and the distance between the openings of the second and third pairs and between the third pair and the fourth opening may be 30 nm to 40 nm; resulting in each finger having a lateral width of 30 nm to 40 nm. The etching of the polysilicon layer 209 may be performed, e.g., by RIE. In this instance, a pair of fingers 303 and 307 are formed per each gate 301 and 305, respectively; however, it is contemplated that more than two fingers may be formed per gate.

Figure 4:
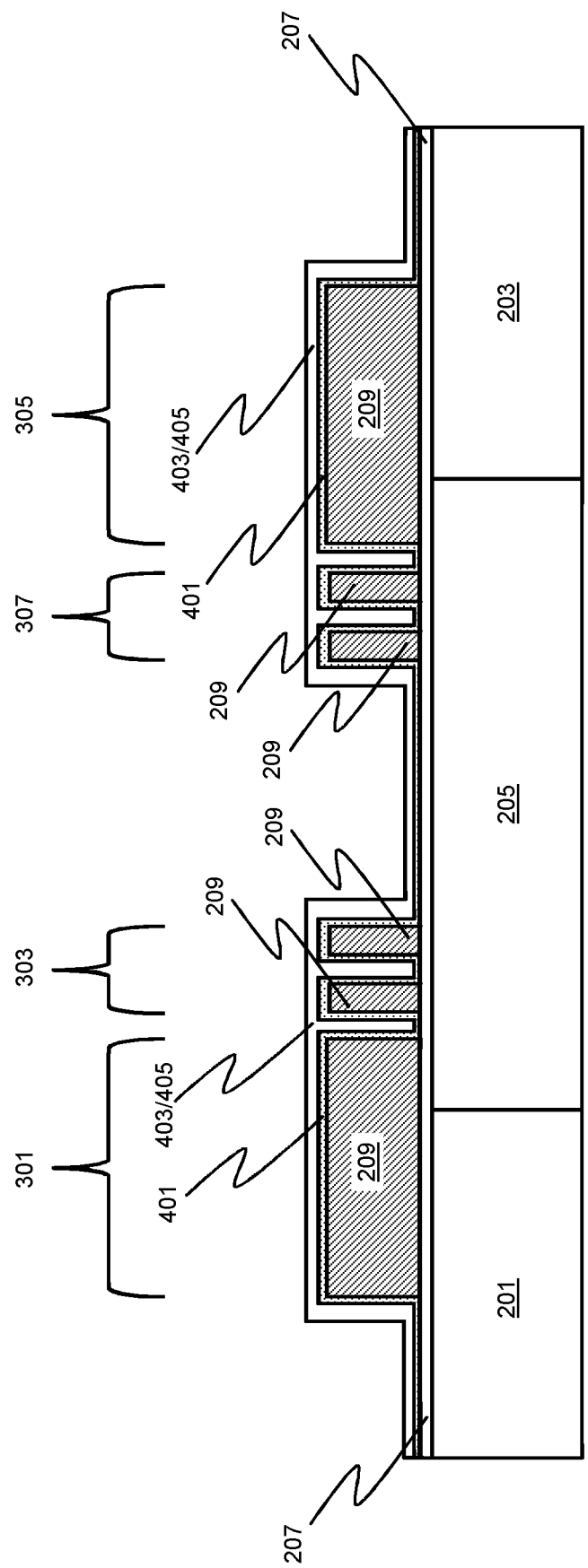

Adverting to FIG. 4, an oxidation layer 401 is formed over the GOX layer 207 and along the sidewalls of the gates 301 and 305 and the fingers 303 and 307. The oxidation layer 401 is actually oxidation post RIE of the polysilicon layer 209 and is formed for recovery of the sidewalls of the gates 301 and 305 and the fingers 303 and 307. The oxidation layer 401 may be formed, for example, to a thickness of 10 Å to 30 Å, e.g., 20 Å. LTO layers 403 and 405 are then sequentially formed over the oxidation layer 401, filling the spaces between gates 301 and 305 and the fingers 303 and 307, respectively. Each of the LTO layers 403 and 405 may be formed, e.g., of chemical vapor deposition (CVD) oxide and to a thickness of 40 Å to 60 Å.

Figure 5:
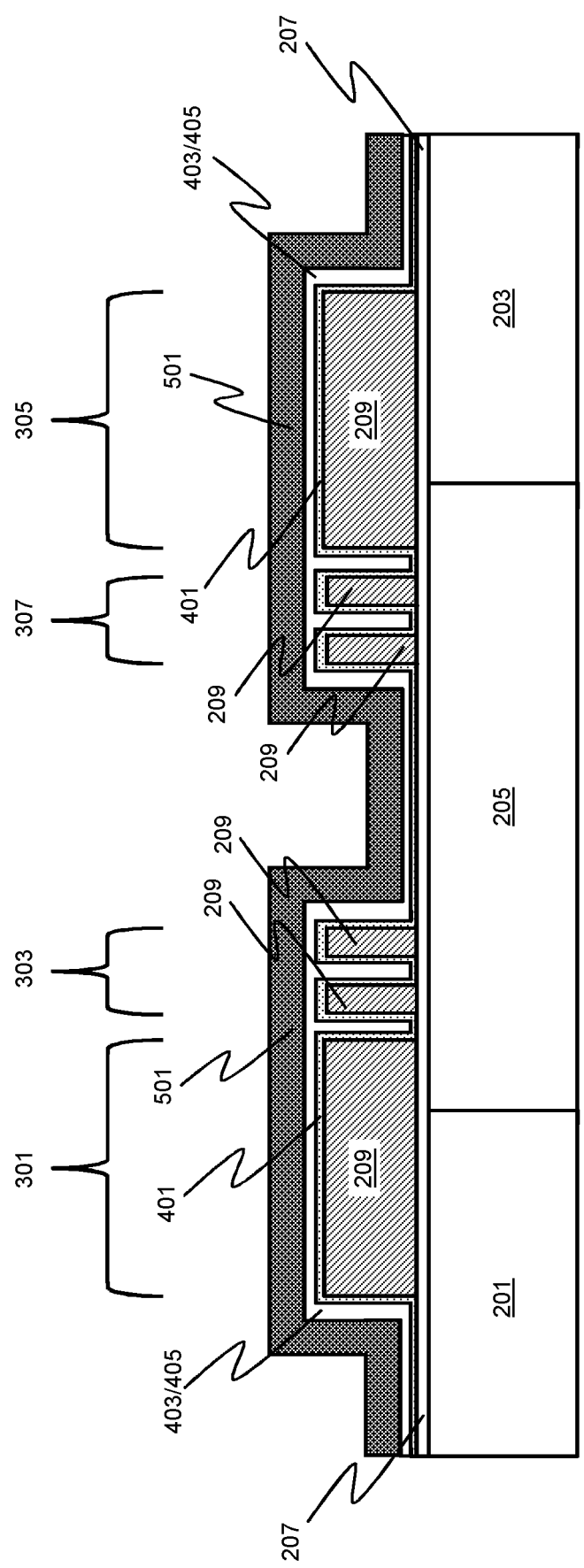
Figure 6:
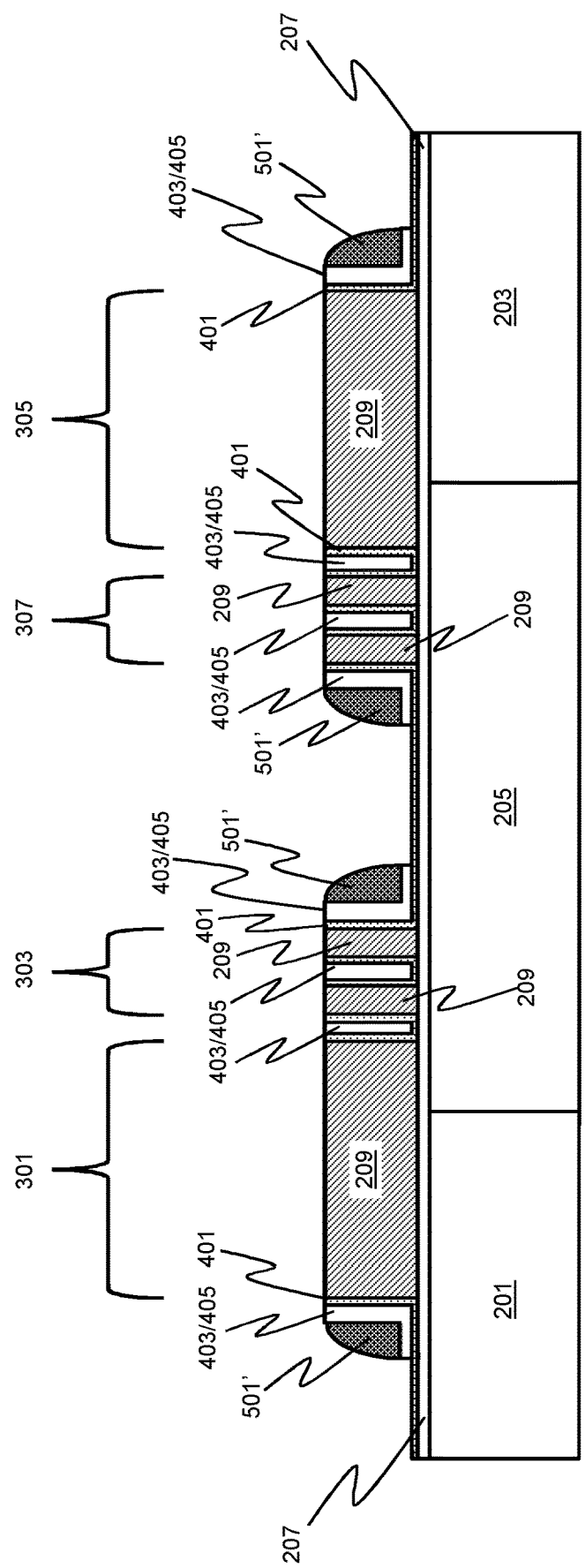
Figure 7:
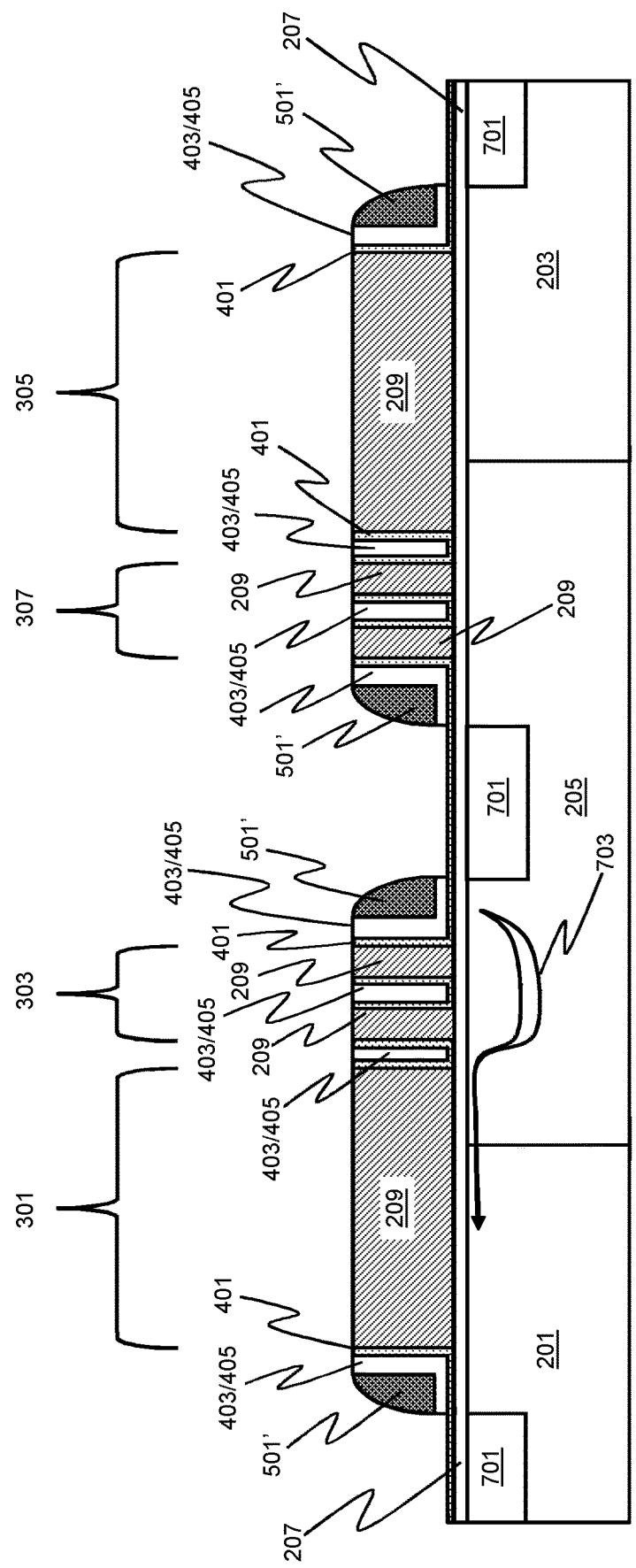

Next, a nitride layer 501 is formed, for example, to a thickness of 300 Å to 400 Å, e.g., 350 Å, over the LTO layer 405, as depicted in FIG. 5. Adverting to FIG. 6, portions of the nitride layer 501, the LTO layers 405 and 403, and the oxidation layer 401 are then removed, e.g., by RIE, to form nitride spacers 501' on opposite sides of the gate 301 and fingers 303 and the gate 305 and fingers 307. Specifically, the LTO layers 403 and 405 filling the spaces between the gates 301 and 305 and the fingers 303 and 307, respectively, remain after the RIE to form the nitride spacers 501'. Thereafter, S/D regions 701, e.g., N+ regions, are formed in each well 201 and 203 and in the substrate 205 with each S/D region 701 being formed adjacent to a nitride spacer 501', as depicted in FIG. 7. Consequently, the nitride spacers 501' are pushed away from the current crowding at the edge of the channel in the on state of the device as shown by the arrows 703.

The embodiments of the present disclosure can achieve several technical effects including improving HCI degradation of an ultra-low-Ron EDNMOS due to charge spreading by pushing away the nitride spacers of the EDNMOS from the edge of the channel with polysilicon fingers without requiring any additional masks. In addition, the present disclosure can achieve less linear drain current ($I_{DLIN}$) degradation and, therefore, better performance relative to known EDNMOS transistors. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices including EDNMOS transistors.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
    a gate oxide (GOX) layer over a substrate;
    a first gate and plurality of fingers over the GOX layer;
    a second gate and plurality of fingers over the GOX layer, the first and second gates and respective plurality of fingers laterally separated;
    an oxide layer along sidewalls of the first and second gates and plurality of fingers and over portions of the GOX layer, wherein the oxide layer comprises:
        an oxidation layer,
        a first low temperature oxide (LTO) layer over the oxidation layer, and
        a second LTO layer over the first LTO layer;
    a nitride spacer over and adjacent to the oxide layer on opposite sides of each gate and plurality of fingers; and
    S/D regions laterally separated in the substrate, each S/D region adjacent to a nitride spacer.

2. The device according to claim 1, wherein the substrate comprises an N-type substrate (n-sub).

3. The device according to claim 2, wherein the n-sub comprises a first and a second P-type well (p-well) laterally separated.

4. The device according to claim 1, wherein the GOX layer has a thickness of 40 angstrom (Å) to 80 Å.

5. The device according to claim 1, wherein a lateral width between a finger and a gate and between each finger of the plurality comprises 30 nanometer (nm) to 40 nm.

6. The device according to claim 1, wherein each finger has a width of 30 nm to 40 nm.

7. The device according to claim 1, wherein the oxidation layer has a thickness of 10 Å to 30 Å.

8. The device according to claim 7, wherein the first LTO layer has a thickness of 40 Å to 60 Å over the oxidation layer.

9. The device according to claim 8, wherein the second LTO layer has a thickness of 40 Å to 60 Å over the first LTO layer.

10. The device according to claim 1, wherein the nitride layer has a thickness of 300 Å to 400 Å.

11. A device comprising:
    a gate oxide (GOX) layer over a substrate;
    a first gate and plurality of fingers over the GOX layer;
    a second gate and plurality of fingers over the GOX layer;
    an oxide layer along sidewalls of the first and second gates and plurality of fingers and over portions of the GOX layer, wherein the oxide layer comprises:
        an oxidation layer,
        a first low temperature oxide (LTO) layer over the oxidation layer, and
        a second LTO layer over the first LTO layer; and
    a nitride spacer over and adjacent to the oxide layer on opposite sides of each gate and plurality of fingers.

12. The device according to claim 11, wherein the first and second gates and respective plurality of fingers are laterally separated.

13. The device according to claim 11, further comprising:
    S/D regions laterally separated in the substrate, each S/D region adjacent to a nitride spacer.

14. The device according to claim 11, wherein the substrate comprises an N-type substrate (n-sub).

15. The device according to claim 14, wherein the n-sub comprises a first and a second P-type well (p-well) laterally separated.

16. A device comprising:
a polysilicon layer formed on a gate oxide (GOX) layer over a substrate;
a first gate and plurality of fingers and a second gate and plurality of fingers laterally separated through the polysilicon layer down the GOX layer,
an oxide layer over the GOX layer and along sidewalls of the first and second gates and plurality of fingers;
a nitride spacer over and adjacent to a portion of the oxide layer on opposite sides of each gate and plurality of fingers; and
source/drain (S/D) regions laterally separated in the substrate, each S/D region adjacent to a nitride spacer,
wherein the substrate comprises an N-type substrate (n-sub) having a first and a second P-type well (p-well) laterally separated,
wherein the oxide layer comprises an oxidation layer and a first low temperature oxide (LTO) layer over the oxidation layer and wherein the oxide layer further comprises a second LTO layer over the first LTO layer.

17. The device according to claim 16, comprising forming the GOX layer to a thickness of 40 angstrom (Å) to 80 Å.

\* \* \* \* \*